(12) United States Patent
Yamada et al.

(10) Patent No.: US 7,939,991 B2
(45) Date of Patent: May 10, 2011

(54) PIEZOELECTRIC GAS EJECTING DEVICE

(75) Inventors: Satoshi Yamada, Niigata-Ken (JP);
Hitoshi Onishi, Niigata-Ken (JP);
Katsuya Sugai, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 556 days.

(21) Appl. No.: 12/113,436

(22) Filed: May 1, 2008

(65) Prior Publication Data

US 2008/0277103 A1 Nov. 13, 2008

(30) Foreign Application Priority Data

May 10, 2007 (JP) ................................ 2007-125537

(51) Int. Cl.
*H01L 41/08* (2006.01)
(52) U.S. Cl. ........................................ 310/324; 310/339
(58) Field of Classification Search .................. 310/324, 310/328, 330–332
See application file for complete search history.

(56) References Cited

U.S. PATENT DOCUMENTS

| | | | | |
|---|---|---|---|---|
| 5,982,801 A | * | 11/1999 | Deak | 372/69 |
| 6,071,087 A | * | 6/2000 | Jalink et al. | 417/322 |
| 6,123,145 A | | 9/2000 | Glezer et al. | |
| 6,262,519 B1 | * | 7/2001 | Furlani et al. | 310/358 |
| 6,588,497 B1 | | 7/2003 | Glezer et al. | |
| 7,682,137 B2 | * | 3/2010 | Nakayama | 417/413.1 |
| 7,793,709 B2 | * | 9/2010 | Mukasa et al. | 165/121 |

FOREIGN PATENT DOCUMENTS

| | | |
|---|---|---|
| JP | 2005-175398 | 6/2005 |
| JP | 2005-256834 | 9/2005 |

* cited by examiner

*Primary Examiner* — Mark Budd
(74) *Attorney, Agent, or Firm* — Brinks Hofer Gilson & Lione

(57) ABSTRACT

A piezoelectric gas jet generator includes a piezoelectric vibrator and upper and lower volume-varying chambers formed above and below the piezoelectric vibrator. In order to effectively use the movement of air supplied with the vibration of the piezoelectric vibrator, plural upper supply pipes and lower supply pipes communicating with the upper and lower volume-varying chambers and protruding from an upper housing and a lower housing are made to protrude in a direction parallel to the plane of the piezoelectric vibrator so as to be parallel to each other. Here, the upper supply pipes and the lower supply pipes are located at different planar positions.

4 Claims, 2 Drawing Sheets

PIEZOELECTRIC GAS EJECTING DEVICE

CLAIM OF PRIORITY

This application claims benefit of the Japanese Patent Application No. 2007-125537 filed on May 10, 2007, which is hereby incorporated in its entirety by reference.

BACKGROUND

1. Field of the Invention

The present invention relates to a gas ejecting device that can supply a gas by allowing a piezoelectric vibrator to vibrate.

2. Description of the Related Art

The applicant of the invention has an interest in using a piezoelectric gas ejecting device having a piezoelectric vibrator to cool a heat source (such as a CPU) of a notebook PC.

The amplitude of a piezoelectric vibrator is in the order of several tens to several hundreds μm. However, when a piezoelectric vibrator is vibrated inside of a chamber the volume of the chamber varies thus creating a volume-varying chamber. As the piezoelectric vibrator vibrates, a jet of gas (air) can be made to go in or out of the chamber by sufficiently reducing the volume of a volume-varying chamber, and thus the heated air around the heat source can be moved and cooled by the use of the gas flow.

The piezoelectric vibrator in which a piezoelectric body is formed on at least one surface of as two-sided shim (conductive thin metal plate) can be made to have a thickness less than 1 mm in total. In addition, volume-varying chambers formed above and below the piezoelectric vibrator may have a small volume for the purpose of supplying compressible air from the vibration of the piezoelectric vibrator. Accordingly, the thickness of the piezoelectric gas ejecting device can be made to be very small and thus is very useful for cooling a small-volume apparatus such as a notebook PC.

SUMMARY

A piezoelectric gas ejecting device includes a piezoelectric vibrator and upper and lower housings constituting volume-varying chambers above and below the piezoelectric vibrator. By allowing the piezoelectric vibrator to vibrate forward and backward, a gas is ejected from supply pipes of the volume-varying chamber as the chamber decreases in volume and a gas is sucked to the supply pipes of the volume-varying chamber as the chamber increases in volume, thereby causing the movement of air in both situations.

In the piezoelectric gas ejecting device, in order to effectively use the movement of air supplied by the vibration of the piezoelectric vibrator, plural upper supply pipes and lower supply pipes, which communicate with the upper and lower volume-varying chambers and protrude from an upper housing and a lower housing, are made to protrude in a direction parallel to the plane of the piezoelectric vibrator so as to be parallel to each other. In addition, the upper supply pipes and the lower supply pipes are located at different planar positions.

Accordingly, the movement of air due to a variation in volume of the upper and lower volume-varying chambers can be concentrated on a target space. In addition, a flow of air ejected from one group of the upper and lower supply pipe groups can be prevented from affecting a flow of air sucked into the other supply pipe group, thereby satisfactorily causing the movement of air for cooling.

DESCRIPTION OF THE EXEMPLARY EMBODIMENT

Figure 1:
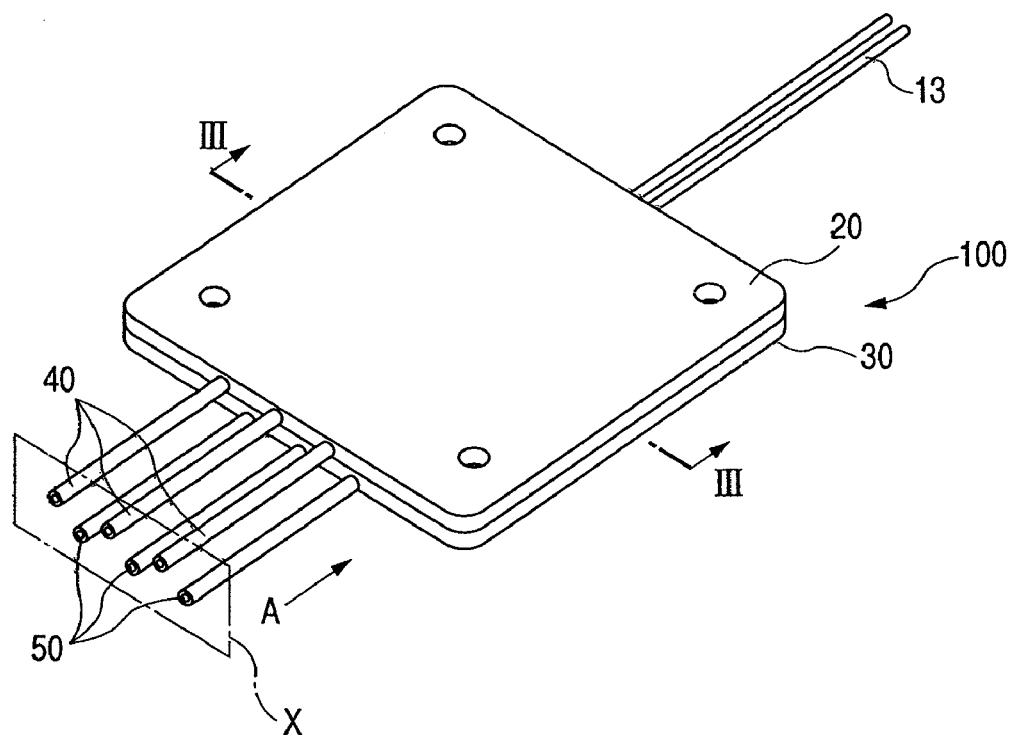
FIG. 1 is a perspective view illustrating a piezoelectric gas jet generator according to an embodiment.
Figure 2:
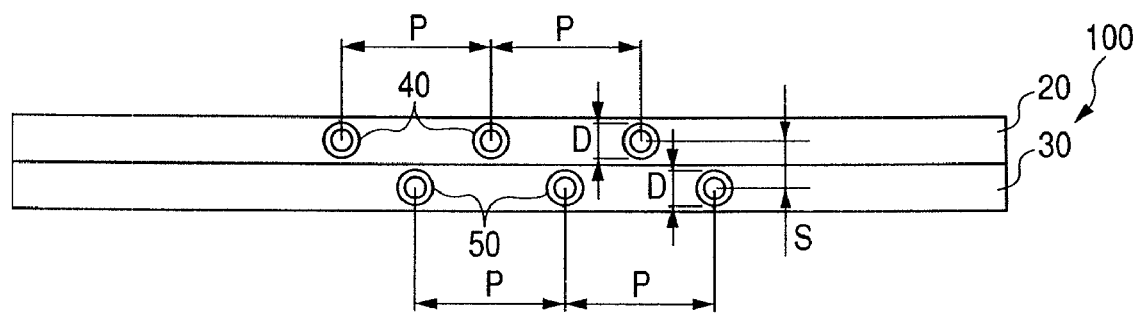
FIG. 2 is a side view of the piezoelectric gas jet generator as viewed in a direction of A of FIG. 1.
Figure 3:
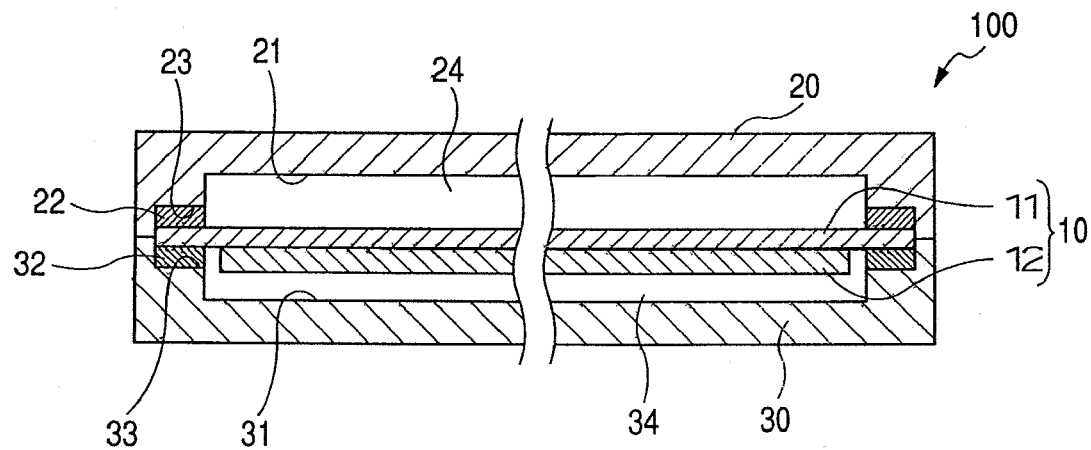
FIG. 3 is a cross-sectional view taken along line III-III of FIG. 1.
Figure 4:
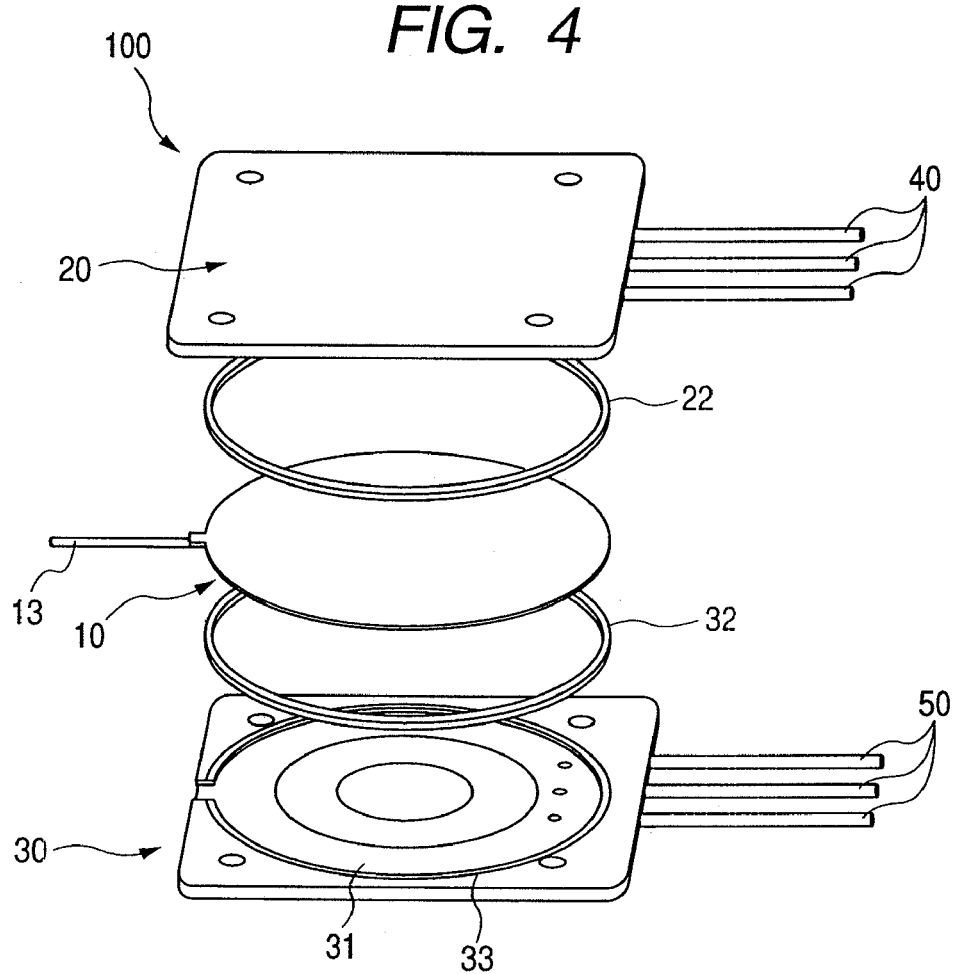
FIG. 4 is an exploded perspective view of the piezoelectric gas jet generator.

FIGS. 1 to 3 show a piezoelectric gas jet generator 100 according to an embodiment. The piezoelectric gas jet generator 100 includes a piezoelectric vibrator 10, an upper housing 20, a lower housing 30, a group of upper supply pipes 40, and a group of lower supply pipes 50.

The upper housing 20 and the lower housing 30 have the same (symmetric) structure of a planar rectangular shape and have a circular concave portion 21 or 31 in the opposed surface thereof. A seal receiving portion 23 or 33 into which a ring-shaped seal member 22 or 32 is inserted is formed around the circular concave portion 21 or 31 (see FIG. 3). The piezoelectric vibrator 10 is held in an air-tight manner between the ring-shaped seal member 22 of the upper housing 20 and the ring-shaped seal member 32 of the lower housing 30 to form an upper volume-varying chamber 24 between the circular concave portion 21 and the piezoelectric vibrator 10 and to form a lower volume-varying chamber 34 between the circular concave portion 31 and the piezoelectric vibrator 10.

The piezoelectric vibrator 10 is of a unimorph type that includes a shim 11 and a piezoelectric body 12 formed on one surface of the shim 11 (see FIG. 3). The thicknesses are exaggerated in FIG. 3. The shim 11 is a conductive thin metal plate made of stainless or 42 alloy with a thickness of about 50 μm. The piezoelectric body 12 is a piezoelectric material of PZT ($Pb(Zr,Ti)O_3$) or the like with a thickness of about 50 to about 300 μm and the surfaces thereof are subjected to a polarizing process. When an alternating electric field is applied to the shim 11 and the exposed surface of the piezoelectric body 12 (across both surfaces of the piezoelectric body 12) through a power supply line 13, a cycle in which one side of the piezoelectric body 12 is expanded and the other is contracted is repeated, thereby allowing the shim 11 (piezoelectric vibrator 10) to vibrate.

The upper supply pipes 40 protrude from one side wall of the upper housing 20 in a direction parallel to the plane of the piezoelectric vibrator 10 and communicate with the upper volume-varying chamber 24. The lower supply pipes 50 protrude from one side wall of the lower housing 30 in the direction parallel to the plane of the piezoelectric vibrator 10 and communicate with the lower volume-varying chamber 34. the upper supply pipes 40 and the lower supply pipes 50 are parallel to each other and the ends thereof are opened at the same cooling space (target space) (see FIG. 1). That is, the upper supply pipes 40 and the lower supply pipes 50 have the same length in this embodiment.

The volumes (sectional areas) of the upper volume-varying chamber 24 (lower volume-varying chamber 34) and the upper supply pipes 40 (lower supply pipes 50) are determined so that the suction and ejection of air resulting from the vibration of the piezoelectric vibrator 10 is made as strong as possible.

The upper supply pipes 40 and the lower supply pipes 50 are different from each other in planar position. As shown in FIG. 2, plural (3 in the figure) upper supply pipes 40 and plural (3 in the figure) lower supply pipes 50 are arranged as the same pitch P and the lower supply pipes 50 (upper supply pipes 40) are located between the upper supply pipes 40 (lower supply pipes 50) in a planar view.

The inter-axis distance S (see FIG. 2) between the upper supply pipes 40 and the lower supply pipes 50 in a direction perpendicular to the plane of the piezoelectric vibrator 10 is smaller than two times the outer diameter D of the upper supply pipes 40 (lower supply pipes 50) (S<2D). In the piezoelectric gas jet generator 100, since the volume of the volume-varying chamber 24 or 34 is small (no jet can be generated when it is not small), the upper housing 20 and the lower housing 30 are decreases in thickness and thus the upper supply pipes 40 and the lower supply pipes 50 approach each other in the direction perpendicular to the plane of the piezoelectric vibrator 10. In this case, when the upper supply pipes 40 and the lower supply pipes 50 are located at the same planar positions, the opening ends of the upper supply pipes 40 and the opening ends of the lower supply pipes 50 get too close to each other and thus the air ejected from one group of pipes is sucked by the other group of pipes. In this situation, it is difficult to generate the satisfactory movement of air in the cooling space X.

In contrast, when the upper supply pipes 40 and the lower supply pipes 50 are located at different planar positions (arranged in a zigzag shape) and the relation of S<2D is satisfied, the opening ends of the upper supply pipes 40 and the opening ends of the lower supply pipes 50 can easily get apart from each other and thus the air ejected from one group of pipes is hardly sucked into the other group of pipes. Accordingly, it is possible to generate satisfactory movement of air in the cooling space X and thus to obtain a high-efficiency cooling operation.

It is preferable that the arrangement pitch P of the supply pipes 40 or 50 is two times or more of the inter-axis distance S. When the arrangement pitch is smaller than two times, the opening ends of the upper supply pipes 40 and the lower supply pipes 50 cannot be satisfactorily separated from each other.

In the above-mentioned piezoelectric gas jet generator 100, the piezoelectric vibrator 10 vibrates so that the amplitude at the center of the planar circle is the most, by applying an alternating electric field to both surfaces of the piezoelectric body 12 through the power supply line 13. Then, in a stroke in which the volume of the upper volume-varying chamber 24 (lower volume-varying chamber 34) increases, air is sucked into the upper volume-varying chamber 24 (lower volume-varying chamber 34) from the upper supply pipes 40 (lower supply pipes 50). In a stroke in which the volume of the upper volume-varying chamber 24 (lower volume-varying chamber 34) decreases, air is ejected to the upper supply pipes 40 (lower supply pipes 50) from the upper volume-varying chamber 24 (lower volume-varying chamber 34). Since the volumes of the upper volume-varying chamber 24 (lower volume-varying chamber 34) and the upper supply pipes 40 (lower supply pipes 50) are determined so that the suction and ejection of air is made as strong as possible, it is possible to generate the movement of air in the target space X, thereby performing a cooling operation.

Although terms "upper" and "lower" have been used in the above-mentioned embodiment, obviously, it does not means upper and lower positions in use of the gas jet generator 100.

Although the piezoelectric vibrator 10 used in the above-mentioned embodiment is of a unimorph type, a bimorph type of piezoelectric vibrator having a great amplitude may be used.

What is claimed is:

1. A piezoelectric gas jet generator comprising:
   a piezoelectric vibrator;
   upper and lower housings configured to form volume-varying chambers above and below the piezoelectric vibrator, respectively; and
   upper supply pipes and lower supply pipes communicating with the upper and lower volume-varying chambers and protruding from the upper and lower housings, respectively,
   wherein the upper supply pipes and the lower supply pipes protrude in a direction parallel to a plane of the piezoelectric vibrator so as to be parallel to each other, and
   wherein the upper supply pipes and the lower supply pipes are disposed at different planar positions.

2. The piezoelectric gas jet generator according to claim 1, wherein an inter-axis distance between the upper supply pipes and the lower supply pipes in a direction perpendicular to the piezoelectric vibrator is set to be smaller than two times the outer diameter of the supply pipes.

3. The piezoelectric gas jet generator according to claim 1, wherein the upper supply pipes and the lower supply pipes have the same pitch and the lower supply pipes are located between the upper supply pipes in a planar view.

4. The piezoelectric gas jet generator according to claim 1, wherein the upper supply pipes and the lower supply pipes have the same length and ends thereof are opened at the same planar position.

* * * * *